(12) United States Patent
Rotem et al.

(10) Patent No.: US 9,477,243 B2
(45) Date of Patent: Oct. 25, 2016

(54) SYSTEM MAXIMUM CURRENT PROTECTION

(71) Applicant: Intel Corporation, Santa Clara, CA (US)

(72) Inventors: Efraim Rotem, Haifa (IL); Nir Rosenzweig, Givat Ella (IL); Doron Rajwan, Rishon Le-Zion (IL); Nadav Shulman, Tel Mond (IL); Gal Leibovich, Kiryat Yam (IL); Tomer Ziv, Rishon Lezion (IL); Amit Gabai, Kiryat Biyalik (IL); Jorge P. Rodriguez, Portland, OR (US); Jeffrey A. Carlson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/579,794

(22) Filed: Dec. 22, 2014

(65) Prior Publication Data

US 2016/0179110 A1  Jun. 23, 2016

(51) Int. Cl.
G06F 1/32 (2006.01)
G05F 1/10 (2006.01)
H03L 7/08 (2006.01)

(52) U.S. Cl.
CPC .............. *G05F 1/10* (2013.01); *G06F 1/324* (2013.01); *H03L 7/08* (2013.01)

(58) Field of Classification Search
CPC ...................................................... G06F 1/324
See application file for complete search history.

(56) References Cited

U.S. PATENT DOCUMENTS

| | | | |
|---|---|---|---|
| 5,539,603 A | 7/1996 | Bingham | |
| 7,394,634 B2 | 7/2008 | Fang et al. | |
| 7,457,971 B2 * | 11/2008 | Pineda De Gyvez | H03K 19/0016 713/300 |
| 7,716,502 B2 * | 5/2010 | Muresan | H04L 9/003 713/300 |
| 8,010,824 B2 * | 8/2011 | Naffziger | G06F 1/26 375/224 |
| 8,060,765 B1 * | 11/2011 | Cha | G06F 1/08 713/300 |
| 8,156,362 B2 | 4/2012 | Branover et al. | |
| 8,527,794 B2 * | 9/2013 | Ibrahim | G06F 1/3206 713/320 |

(Continued)

FOREIGN PATENT DOCUMENTS

TW  200631277 A  9/2006

OTHER PUBLICATIONS

Notification of Transmittal of the International Search Report and Written Opinion of the International Searching Authoirty, or the Declaration issued for the International Patent Application No. PCT/US2015/059762, mailed Apr. 22, 2016.

(Continued)

*Primary Examiner* — Thomas J Hiltunen
(74) *Attorney, Agent, or Firm* — Blakely, Sokoloff, Taylor & Zafman LLP (57) ABSTRACT

A method and apparatus for providing proactive current protection. In one embodiment, the method comprises: prior to transitioning to a new state for an integrated circuit (IC), calculating a sum of expected powers for a plurality of domains in the IC by calculating an expected current for each of the plurality of domains based on an individual domain frequency in the new state and multiplying the expected current with its associated voltage for each of the plurality of domains for the new state; comparing the sum to a power limit; and if the sum is greater than the power limit, then reducing the individual domain frequency associated with at least one domain in the plurality of domains to maintain the total instantaneous power of the IC below the power limit.

23 Claims, 9 Drawing Sheets

(56) References Cited

U.S. PATENT DOCUMENTS

| | | | |
|---|---|---|---|
| 8,775,833 B2 | 7/2014 | Ananthakrishnan et al. | |
| 9,069,555 B2* | 6/2015 | Fetzer | G06F 1/324 |
| 9,250,910 B2* | 2/2016 | Hurd | G06F 9/38 |
| 2012/0053897 A1 | 3/2012 | Naffziger | |
| 2012/0185706 A1 | 7/2012 | Sistla et al. | |
| 2013/0145180 A1* | 6/2013 | Branover | G06F 1/00 |
| | | | 713/300 |
| 2013/0151869 A1* | 6/2013 | Steinman | G06F 1/324 |
| | | | 713/300 |
| 2013/0332753 A1 | 12/2013 | Varma et al. | |
| 2014/0237272 A1* | 8/2014 | Sadowski | G06F 1/3275 |
| | | | 713/320 |
| 2014/0359328 A1* | 12/2014 | Burns | G06F 1/324 |
| | | | 713/322 |
| 2015/0028937 A1* | 1/2015 | Bickford | H03L 1/02 |
| | | | 327/509 |
| 2015/0177751 A1* | 6/2015 | Valka | G06F 1/324 |
| | | | 327/540 |

OTHER PUBLICATIONS

Notice of Allowance for Application No. 104138570, filed on Nov. 20, 2015, mailed Aug. 23, 2016, 4 pages.

* cited by examiner

SYSTEM MAXIMUM CURRENT PROTECTION

FIELD OF THE INVENTION

Embodiments of the present invention relate to the field of power management; more particularly, embodiments of the present invention relate to determining whether expected current for a device (e.g., system-on-a-chip (SOC)) is within the current for the device.

BACKGROUND OF THE INVENTION

High performance SoCs are subject to a series of power delivery network (PDN) limitations. One such limitation involves small batteries and their potential for becoming stressed into failure by short bursts of high power consumption from a process running on an SoC. If the instantaneous power being consumed by the SoC is able to exceed a set limit, the instantaneous power may significantly impact the power supply and battery. Also, exceeding this limit can result in an I*R voltage drop that can result with "blue-screen" or trigger overcurrent protection and shut down the system. Thus, the instantaneous current can pose a significant limitation on the system.

To compensate for these PDN limitations, a number of power management techniques have been used or have been developed. There are reactive techniques that can be used after a power limit has been exceeded. These include power limit 1 (PL1), power limit 2 (PL2) and power limit 3 (PL3). PL1 is the long-term CPU power limit that the system can withstand without overheating. PL2 is the short-term burst limit used for temporary excursions to higher clocks (e.g., a quick trip to a faster clock frequency to improve responsiveness while loading a program). PL3 is dynamic voltage and frequency scaling technique used on a chip. PL2 is measured in seconds, while the PL3 limit is monitored in milliseconds to prevent instantaneous power use from damaging a device's battery. These techniques both require power measurements to be made, and in response to those power measurement, both PL2 and PL3 lower a SoC's frequency. However, because these techniques require power measurements, they are too slow to respond and reduce the SoC's instantaneous power when it rises to high.

In another reactive approach, an interface on the platform level monitors when the instantaneous power limit is surpassed and sends a signal, from the platform, to the central processing unit (CPU) to throttle its operation and bring the current down below the instantaneous limit.

In yet another reactive approach, a calculation of the current per voltage regulator domain is made to see if the current is above a maximum value (limit). However, this approach is not used for multiple voltage regulator (VR) domains and, thus, is not appropriate for package level power delivery problems, because limiting power in each VR domain can cause an undesirable reduction in performance of domains and increased cost for higher limits. However, because these techniques are reactive in nature, they cannot prevent the instantaneous current from becoming too high and causing damage before they are returned to a safer level.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

A method and apparatus to limit the power of an integrated circuit (IC) is disclosed. The IC may be a system-on-a-chip (SoC), a processor, etc. The power limit process performs proactive calculations and maintains the total IC instantaneous power below the power limit.

More specifically, the power calculation is done proactively before making a transition to a new state for the IC (e.g., a new working point). When a request is made to transition into a new state, the expected current for each domain (e.g., a voltage regulator (VR) domain) is calculated and multiplied by a target voltage for that new state to create a sum representing the expected power for that domain when in the new state. In one embodiment, the expected current for each domain is calculated based on leakage, maximum power vs. dynamic capacitance ($C_{dyn}$) and target frequency to be used in the new state. All of the expected power values for the various domains are added together to create a total expected power, which is compared to the power limit. If the total expected power is greater than the limit, then the frequency of one or more of the domains is reduced so that the total power of the new state (e.g., the new working point) would be below the power limit.

Figure 1:
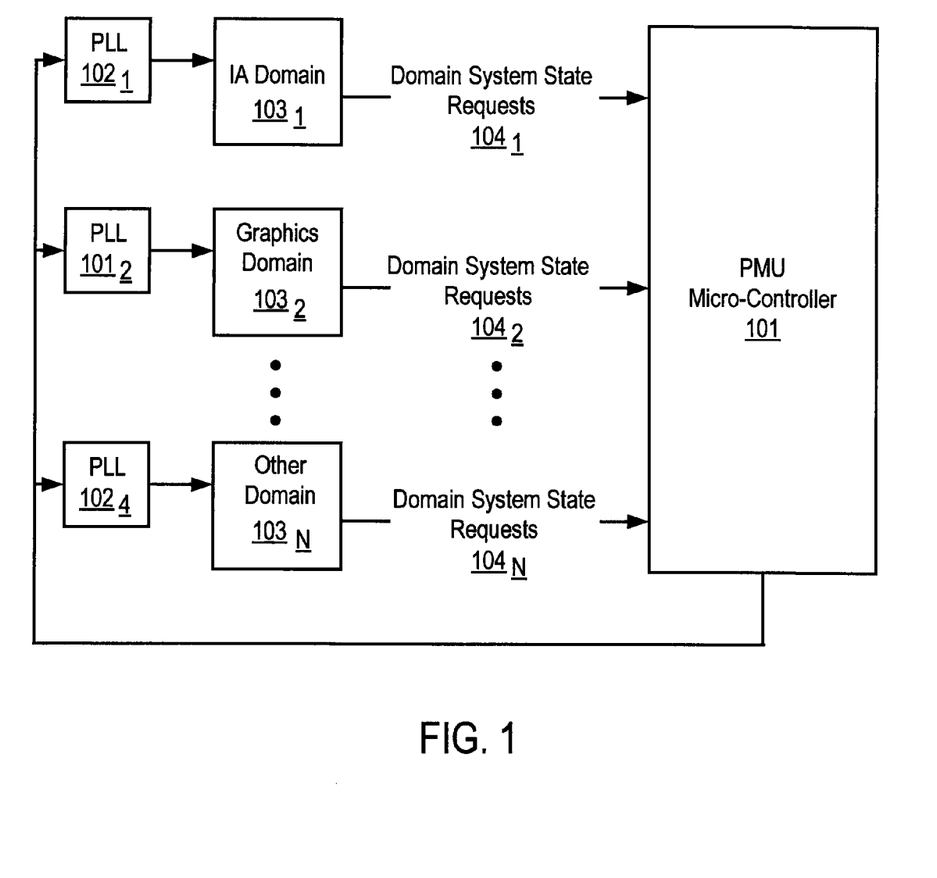
FIG. 1 is a block diagram of one embodiment of an integrated circuit (IC).

FIG. 1 is a block diagram of one embodiment of an integrated circuit (IC). Referring to FIG. 1, the integrated circuit includes a number of domains. For example, instruction architecture (IA) domain $103_1$ (e.g., a central processing unit (CPU) domain), a graphics domain $103_2$, and one or more other domains such as domain $103_N$. Each domain may have one or more cores (e.g., processor core, execution core) or special purpose logic.

In one embodiment, Power Management Unit (PMU) microcontroller 101 controls and manages power for the IC. In one embodiment, PMU microcontroller 101 specifies a frequency of a clock for each of the domains. PMU microcontroller 101 signals each of those frequencies to phase locked loops (PLLs) associated with each of the domains. For example, the PLLs include PLL $102_1$ which provides clock for IA domain $103_1$, PLL $102_2$ which provides the clock to graphics domain $103_2$, and PLL $104_N$ which provides a clock for domain $103_N$. In one embodiment, PMU microcontroller 101 is part of a CPU.

In one embodiment, each of domains 103 provides a domain specific system state request to PMU microcontroller 101. For example, IA domain $103_1$, graphics domain $103_2$ and other domain $103_N$ provide domain specific system state requests $104_1$, $104_2$, $104_N$ to PMU microcontroller 101. The specific system state requests specifies the state that the particular domain is going to be in after a transition. In one embodiment, the system state request includes a frequency and at least one of a sleep state or an execution state. Note that sleep state and execution states for processor cores and domains associated with processor cores are well known in the art.

Based on the received domain system state requests, PMU microcontroller 101 generates calculates, for each domain, the expected current associated with the system state it will be in after the transition as well as the expected power associated with the domain in that system state. In other words, before every change in system state, PMU microcontroller 101 calculates expected current for each domain at the new working point. Note that after each transition, some domains may be in the same or a different system state, and therefore, the expected power calculations for one or more of the domains may be equal to their current power usage.

PMU microcontroller sums the expected powers for all the domains and compares the sum to a power limit. In one embodiment, this power limit is an instantaneous power limit. In one embodiment, the power limit is set any an external agent (e.g., BIOS, an embedded controller, etc.). In another embodiment, the power limit is set by control software. In such a case, the control software sets either statically or at runtime.

If the sum does not exceed the power limit, PMU microcontroller 101 does nothing and allows the transition into the system state. If the sum does exceed the power limit, PMU microcontroller 101 takes one or more actions to lower the expected power that results from the transition. In one embodiment, one of the actions performed by PMU microcontroller 101 when the sum exceeds the power limit is to reduce the frequency of the system state for each of the domains. PMU microcontroller 101 then signals the reduced frequency to the corresponding clock generator (e.g., PLL) for use in generating a clock for its domain. In this manner, PMU microcontroller 101 performs domain frequency control.

In one embodiment, for each domain, PMU microcontroller 101 calculates both the active and static current that is expected to exist for the domain when is in the new system state it requested. In one embodiment, PMU microcontroller 101 calculates the active current by summing the worst case $C_{dyn}$ for over all waking cores (i.e., cores that are not in idle or otherwise in powered down (e.g., gated) state). The worst case $C_{dyn}$ varies according to the execution state of the domain. PMU microcontroller 101 multiplies the worst case $C_{dyn}$ by the frequency and voltage associated with the requested system state. In one embodiment, the frequency is specified in the requested system state information, while the voltage is determined by the PMU microcontroller 101 as a function of the frequency.

PMU microcontroller 101 also determines the static current of the domain. In one embodiment, the static current is determined by taking the estimated leakage at that voltage of the domain in the requested state and the current temperature (as measured with temperature sensors). PMU microcontroller 101 sums the estimated leakage over all leaking cores in the domain, and gated cores are not counted. Note that the base core leakage can vary according to internal gating.

Once the active and static currents for the domain in the requested system state have been determined, PMU microcontroller 101 sums the active current and static current together. This represents the worst case current for a domain.

In an alternative embodiment, the current for the domain in the requested system state may be based on previously measured currents, where a maximum current is identified over time. This maximum current would then be used as the worst case current for the domain.

PMU microcontroller 101 multiplies this worst case current per domain by its voltage for the requested system state (at the specified frequency) to get the calculated worst case power for the domain. PMU microcontroller 101 sums the calculated worst case powers for all of the domains to obtain the calculated worst case power for the IC taking into account the system states requested by all the domains.

PMU microcontroller 101 compares the total calculated worst case (expected) power with a power limit. If the calculated power is below the power limit, no action is taken and the transition to the requested system states by each of the domains occurs. If the calculated power is above the power limit, then PMU microcontroller 101 takes one or more actions, such as reducing the frequencies that the domains will use in the new system state by a factor. In one embodiment, this factor is the ratio between the power limit and the calculated power:

power limit/calculated worst case power.

In one embodiment, PMU microcontroller 101 lowers the requested frequency of each domain by the ratio. That is, the reduction is done by calculating the ratio and multiplying it by each of the frequencies. In one embodiment, if the result of the multiplication is not a round number, the reduced frequencies are rounded down. This should ensure that the power usage associated with new system state, or working point, is below the power limit. If not, the process is repeated again.

In another embodiment, the ratio is only applied to a subset of domains. In this case, one or more additional power reduction actions may need to be performed to bring the expected power under the power limit. For example, in one embodiment, frequencies in the SoC system agent (SA) domain are not throttled. These include frequencies of the memory clock. In such a case, extra throttling has to be done to the other domains, such as the instruction architecture (IA) domain to compensate. In yet another embodiment, the new frequency for each domain is selected in an alternative manner.

Figure 2A:
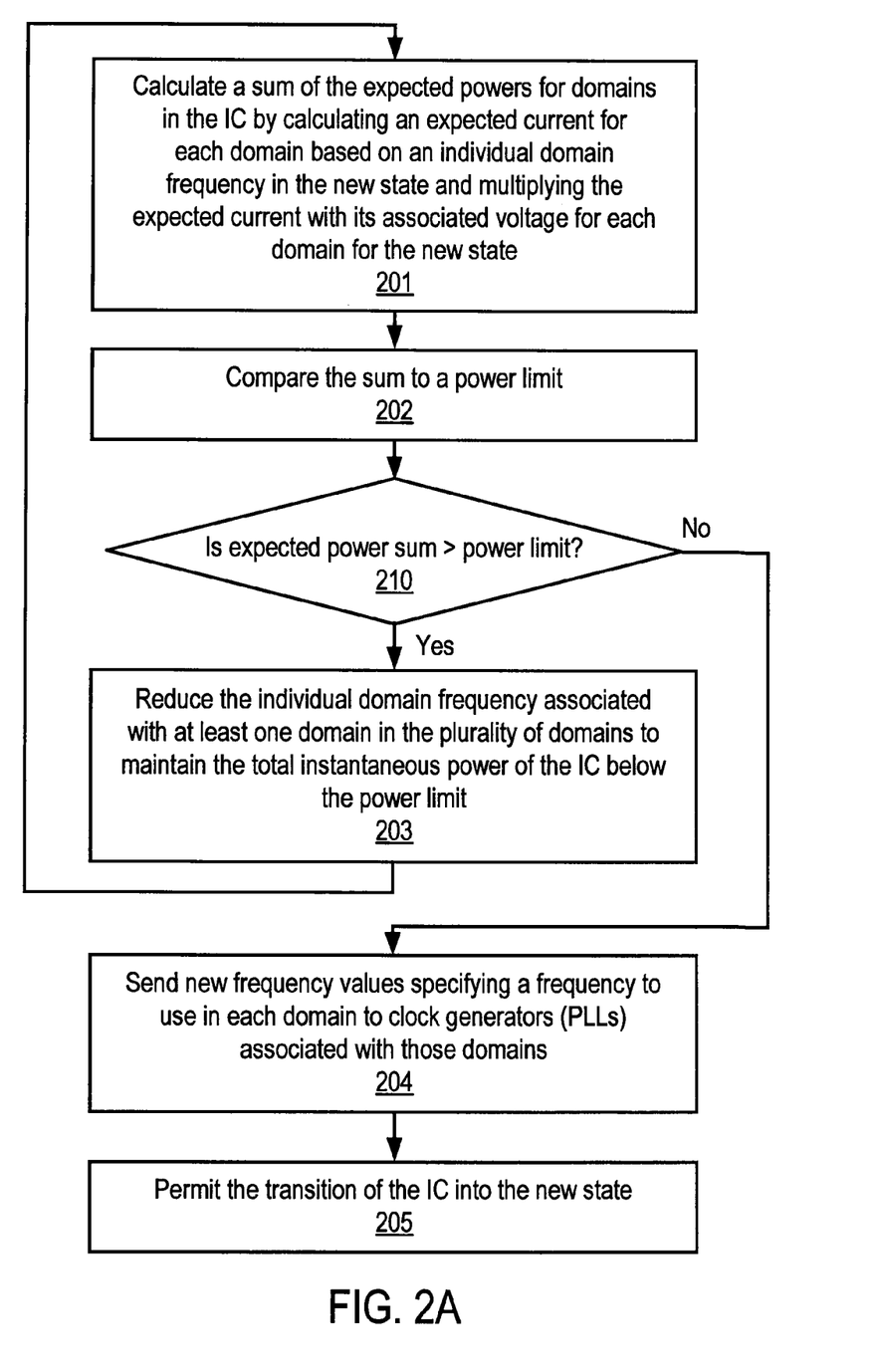
FIG. 2A is a flow diagram of one embodiment of a process for performing a system state transition.

FIG. 2A is a flow diagram of one embodiment of a process for performing a system state transition. The process is performed by processing logic that may comprise hardware (circuitry, dedicated logic, etc.), software (such as is run on a general purpose computer system or a dedicated machine), firmware, or a combination of these three.

Referring to FIG. 2A, prior to transitioning to a new state for an integrated circuit (IC), processing logic calculates a sum of the expected powers for domains in the IC by calculating an expected current for each of the plurality of domains based on an individual domain frequency in the new state and multiplying the expected current with its associated voltage for each of the plurality of domains for the new state (processing block 201). In one embodiment, calculating the expected current for each domain is based on current leakage, target frequency, and dynamic capacitance ($C_{dyn}$). In one embodiment, the new state includes a frequency and one or more of a sleep state and execution state for each domain. In one embodiment, calculating the expected current for each domain comprises calculating active and static current for each domain and then summing the two together.

Figure 2B:
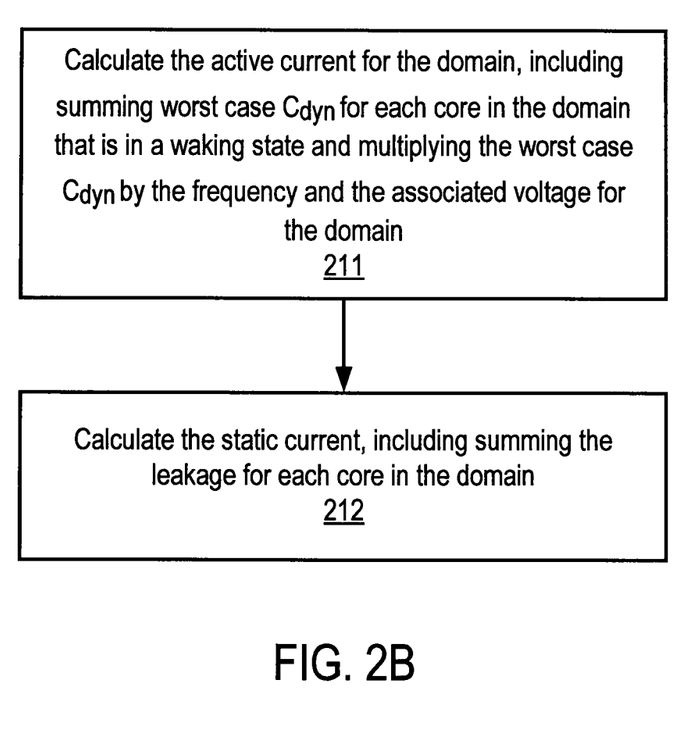
FIG. 2B is a flow diagram of one embodiment for calculating the expected current for each domain.

FIG. 2B is a flow diagram of one embodiment for calculating the expected current for each domain. The process is performed by processing logic that may comprise hardware (circuitry, dedicated logic, etc.), software (such as is run on a general purpose computer system or a dedicated machine), firmware, or a combination of these three. Referring to FIG. 2B, the process includes calculating the active current for the domain, including summing worst case $C_{dyn}$ for each core in the domain that is in a waking state and multiplying the worst case $C_{dyn}$ by the frequency and the associated voltage for the domain (processing block 211). In one embodiment, the associated voltage is a function of the requested frequency.

As part of the process, processing logic also calculates the static current by summing the leakage current for each core in the domain (processing block 212). These are cores that are in a waking state, and not in an idle or powered down (e.g., power gated) state. In one embodiment, the leakage current is the estimated leakage current at the voltage and temperature of the core (domain).

Referring back to FIG. 2A, after calculating the sum of the expected power for the domains, processing logic compares the sum to a power limit (processing block 202). Next, processing logic tests whether the sum of the expected power for the domains is greater than the power limit (processing block 210). If the sum is greater than the power limit, then processing logic transitions to processing block 203 where processing logic reduces the frequency associated with at least one domain (e.g., more than one domain, all domains) in the plurality of domains to maintain the total instantaneous power of the IC below the power limit and the process transitions to processing block 201 where the process repeats. In one embodiment, reducing the individual domain frequency associated with each domain in the plurality of domains comprises calculating a ratio between the total of the expected worst case power for the domains and the power limit and reducing the individual domain frequency associated with each domain in the plurality of domains by at least the ratio.

In one embodiment, if the sum is greater than the power limit, processing logic also sends a notification to indicate that the sum is greater than the power limit. In one embodiment, the notification is sent to software (e.g., the operating system, BIOS, etc.). In one embodiment, the notification is made by setting a status bit in a memory on the IC (e.g., a machine state register (MSR), memory-mapped input/output (MMIO) register. In another embodiment, the notification is made through the use of an interrupt.

Referring back to processing block 210, if the sum of the expected power for the domains is less than the power limit (and after the selected frequency or frequencies for the domain(s) have been reduced), then the process transitions to processing block 204 where processing logic sends new frequency values specifying a frequency to use in each domain to clock generators (PLLs) associated with those domains.

If the sum of the expected powers for the domains is less than the power limit, then processing logic permits the transition into the new state (processing block 205).

Figure 3:
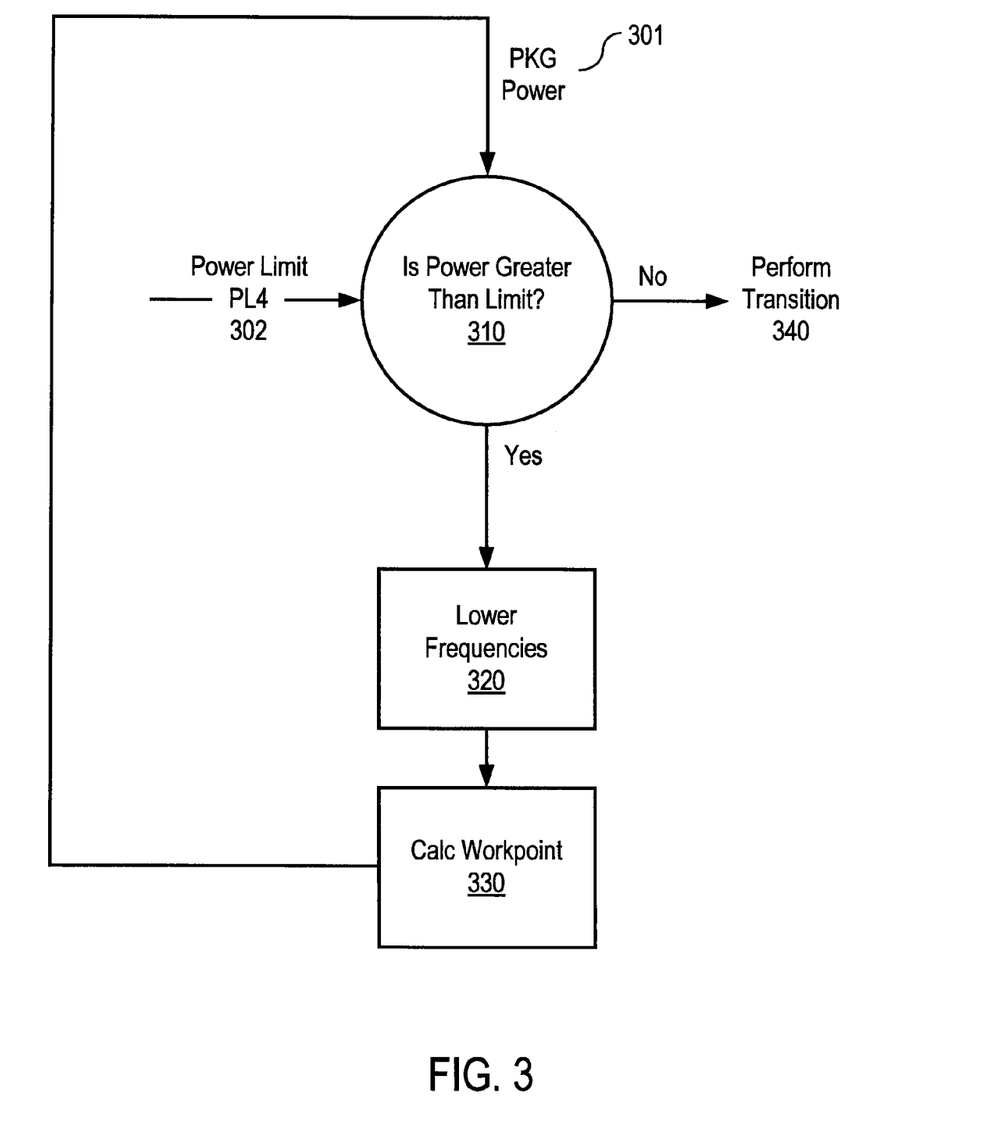
FIG. 3 is a flow diagram of another embodiment of a process for determining whether to perform a system state transition based on a power comparison.

FIG. 3 is a flow diagram of one embodiment of a process for determining whether to perform a system state transition. The process is performed by processing logic that may comprise hardware (circuitry, dedicated logic, etc.), software (such as is run on a general purpose computer system or a dedicated machine), firmware, or a combination of these three. In one embodiment, the process is performed by a power management unit in a device (e.g., a SoC, a processor, etc.).

Referring to FIG. 3, processing logic tests whether the power 301 associated with a new system state (sum of expected power for the domains) is greater than the power limit 302 associated with the power limit for the platform (processing block 310). If it is not, processing logic transitions to processing block 340 where processing logic performs the transition to the new system state. However, if the power 301 associated with the new system state is greater than power limit 302, the processor transitions to processing block 320 where processing logic lowers the frequencies. In one embodiment, the reduction is done by calculating a ratio and multiplying it by each of the frequencies that have been requested by each of the domains. In one embodiment, the ratio is the power limit divided by total expected power of the domains. Each of the frequencies requested for the new system state is multiplied with the ration to create the frequency that will be used in the new system state. In one embodiment, any necessary rounding of the newly calculated frequency values is performed by rounding down the values.

After lowering the frequencies, processing logic calculates a new work point (processing block 320) and transitions to processing block 310 to repeat the process.

Figure 4:
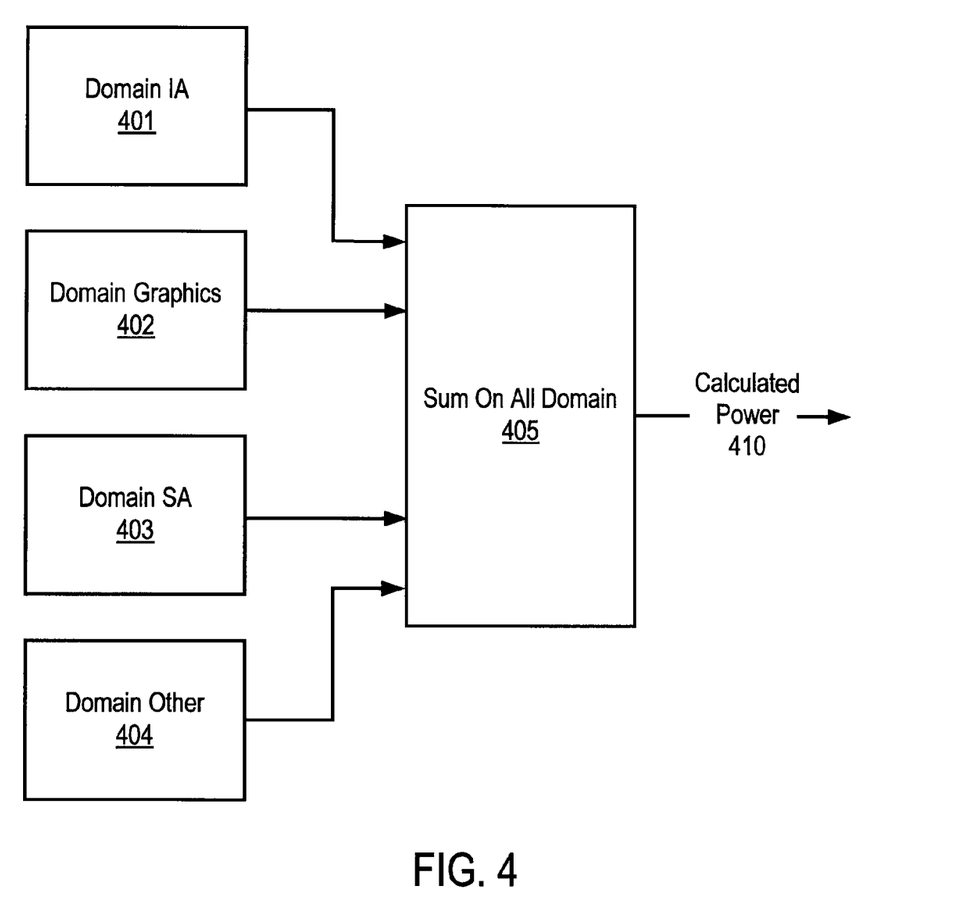
FIG. 4 is a flow diagram of one embodiment of the process for summing the power for all the domains.

FIG. 4 is a flow diagram of one embodiment of the process for summing the power for all the domains. The process is performed by processing logic that may comprise hardware (circuitry, dedicated logic, etc.), software (such as is run on a general purpose computer system or a dedicated machine), firmware, or a combination of these three. In one embodiment, the process is performed by a power management unit in a device (e.g., a SoC, a processor, etc.).

Referring to FIG. 4, a per domain power calculation based on the expected power in their new state after the transition is performed for each of the domains, such as domain IA 401, domain graphics 402, domain SA 403 and other domain 404. As discussed herein, while only four domains are shown in FIG. 4, the device may have more or less domains for which a separate per domain power calculation are performed.

The expected power calculation for each of the domains are summed by summing logic 405 to generate the calculated power. The calculated power 410 is an input to the PMU logic to determine whether the system can transition to a new system state.

Figure 5:
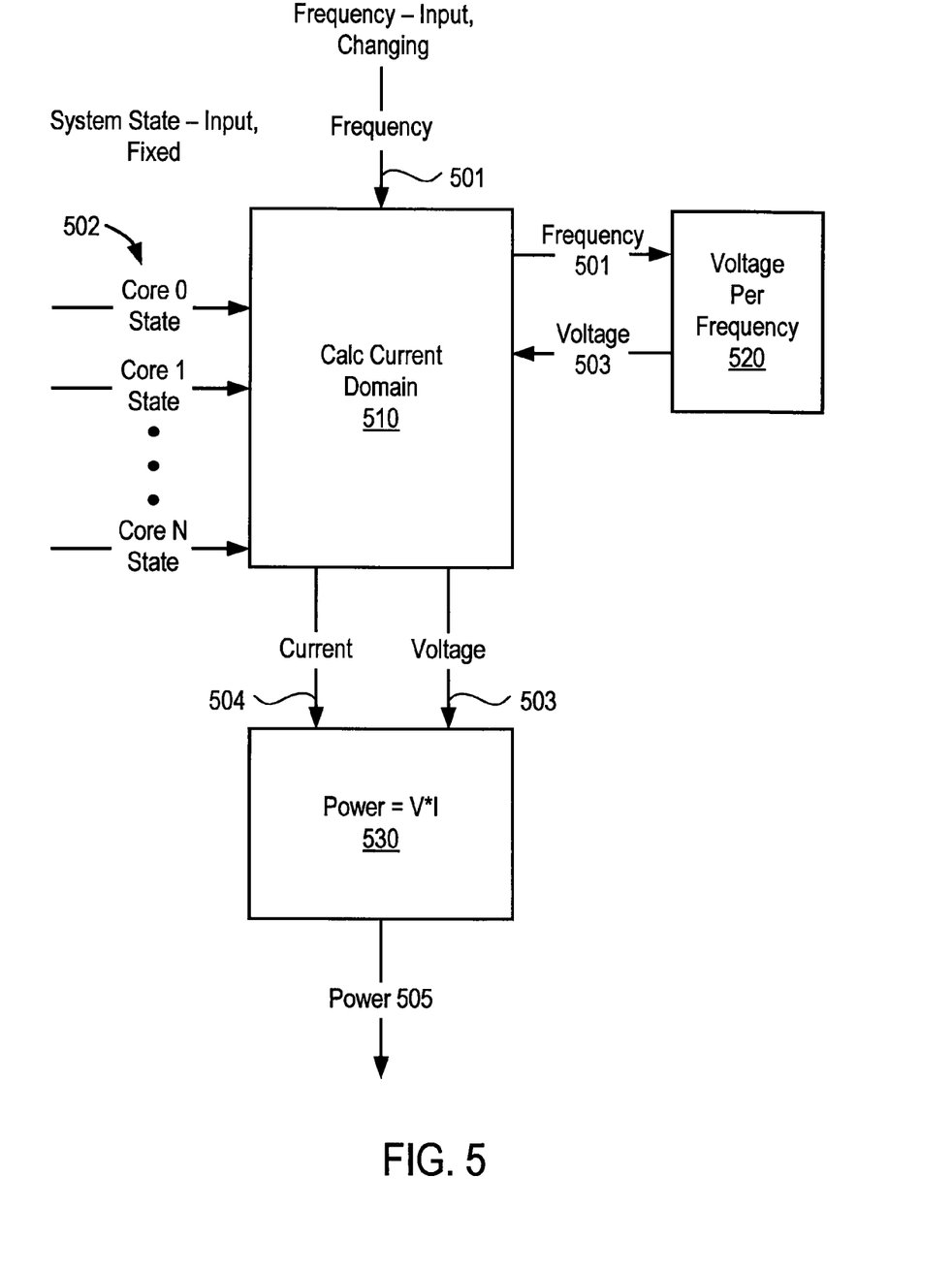
FIG. 5 is a flow diagram of one embodiment of a process for performing a per domain power calculation.

FIG. 5 is a flow diagram of one embodiment of a process for performing a per domain power calculation. The process is performed by processing logic that may comprise hardware (circuitry, dedicated logic, etc.), software (such as is run on a general purpose computer system or a dedicated machine), firmware, or a combination of these three. In one embodiment, the process is performed by a power management unit in a device (e.g., a SoC, a processor, etc.).

Logic 510 for calculating the current and voltage for the current domain receives an input frequency 501 along with system state inputs 502. Frequency 501 represents the frequency the domain requests to use when in the new system state. The core state inputs represent the new system states of different cores in the domain. As shown, there are state inputs for cores 0-N. Note that some domains may only have one core, while other domains have two or more cores. In case of a multi-core domain, all cores are clocked at the same frequency, though this is not required for teachings described herein.

Domain current calculator 520 sends frequency 501 to logic 520 which generates a voltage 503 associated with the new state based on frequency 501. In one embodiment, a frequency-voltage curve is used to assign each frequency a matching voltage. In one embodiment, logic 520 includes a table that specifies a particular voltage associated with each frequency to which is provided. The logic 510 uses these inputs to determine the expected current that would be associated with the new state. Logic 510 outputs expected current 504 along with voltage 503 to power calculation unit 530. Power calculation unit 530 multiplies expected current 504 with voltage 503 to generate power 505, which represents the worst case power that the domain in the new state.

Figure 6:
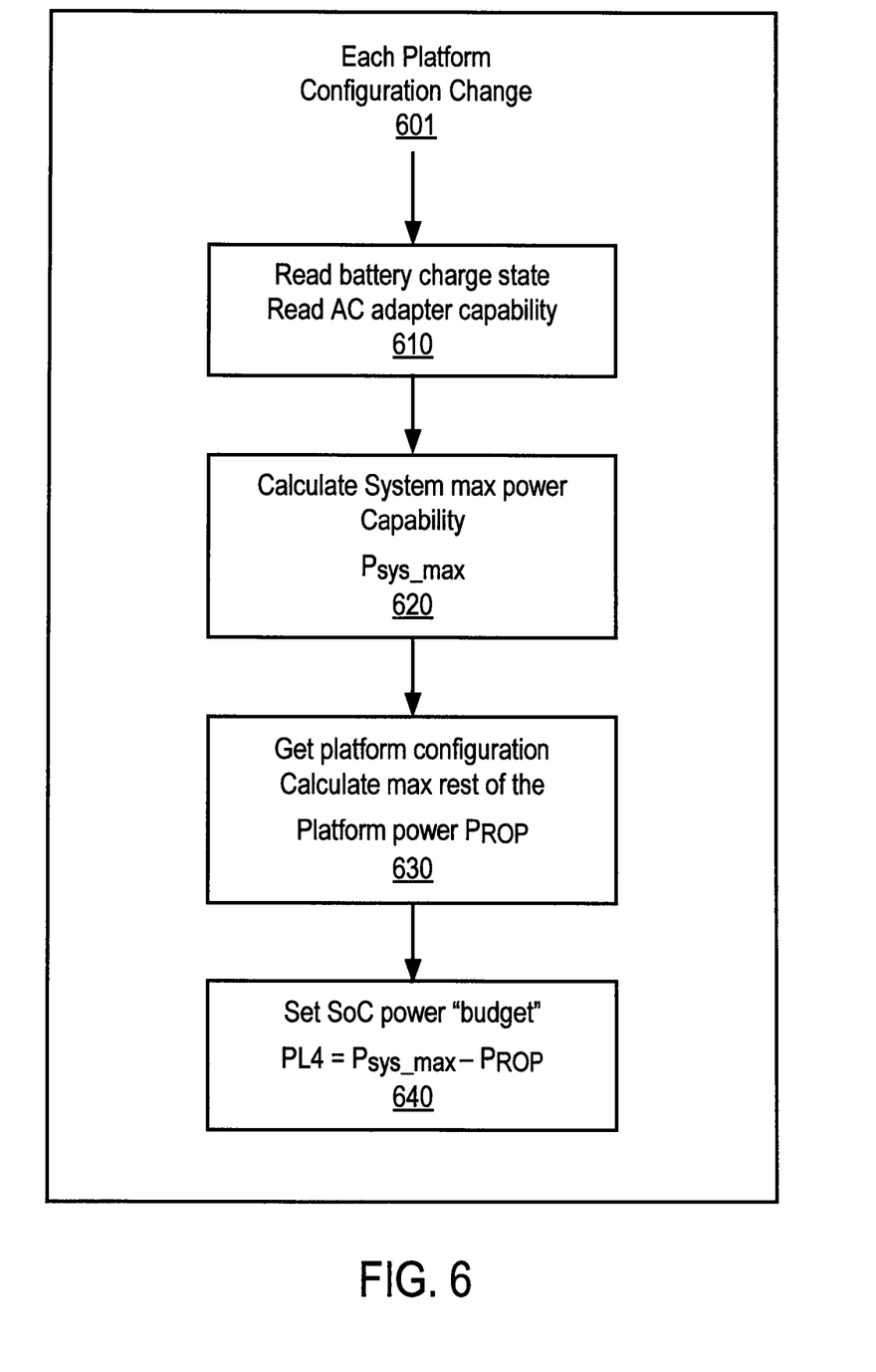
FIG. 6 is a flow diagram of one embodiment of a process for performing the platform power calculation.

FIG. 6 is a flow diagram of one embodiment of a process for performing the platform power calculation. The process is performed by processing logic that may comprise hardware (circuitry, dedicated logic, etc.), software (such as is run on a general purpose computer system or a dedicated machine), firmware, or a combination of these three. In one embodiment, the process is performed by a power management unit in a device (e.g., a SoC, a processor, etc.).

Processing logic receives a configuration change indication 601. In one embodiment, indication 601 relates to a battery drain situation. As the battery drains, it can sustain lower power draws, voltage drops as the battery drains. A sudden power drain can cause a sudden voltage drop, and if the battery is drained, it can sustain lower power drain before it goes below a voltage threshold. To avoid this, software sets a limit according to battery drain, triggering a change in the indication. This enables to extend battery life.

In response to this configuration change indication 601, processing logic reads the battery charge state as well as the capability of the alternating current (AC) adapter, or other unlimited power supply (processing block 610). Using this information, processing logic calculates the maximum power capability for this system ($P_{sys\_max}$) for a platform having that battery and AC adapter (processing block 620). Next, processing logic obtains the platform configuration and calculates the maximum platform power associated with the rest of the platform (processing block 630). The maximum platform power for the rest of the platform corresponds to the power for the domains that are not counted. Then, processing logic sets the SOC (or IC) power budget, or limit, as the difference between the calculated maximum power capability of the system less the maximum power for the rest of the platform. In other words, $$PL4=P_{sys\_max}-P_{ROP}.$$

Figure 7:
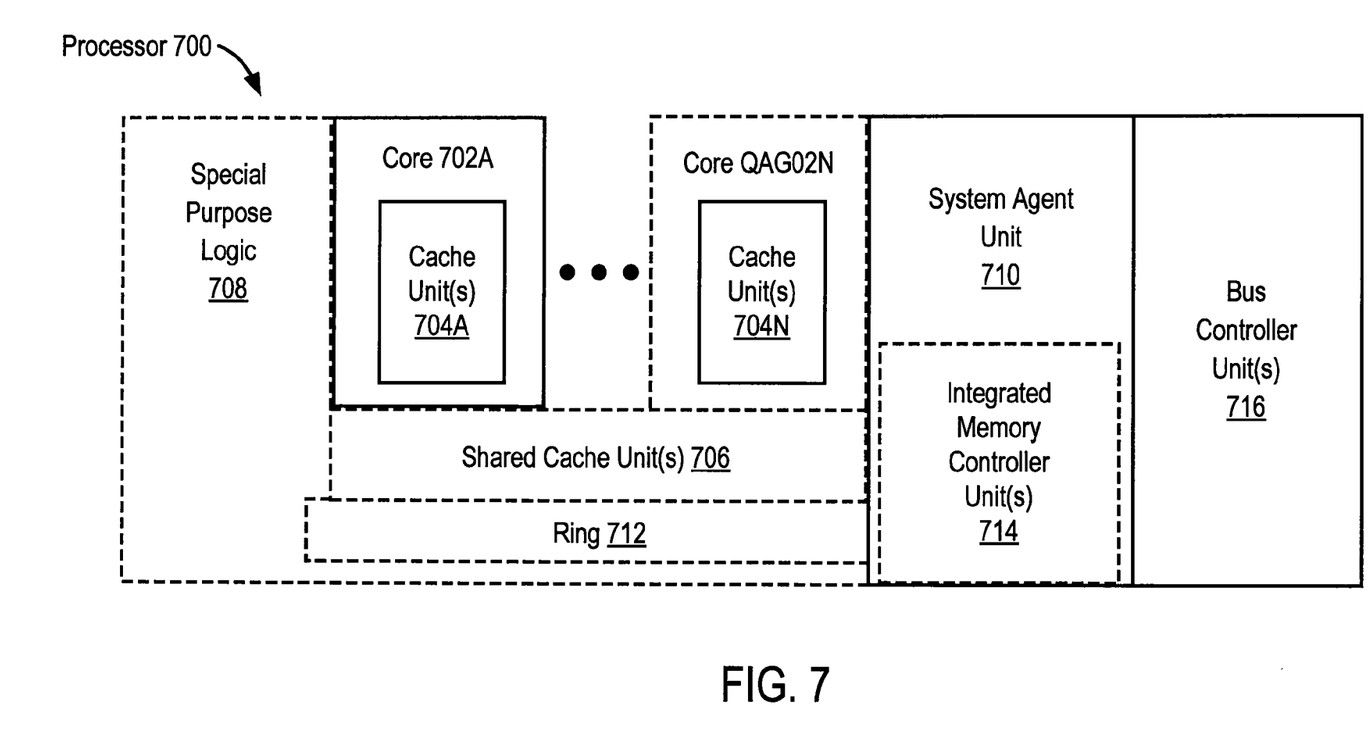
FIG. 7 is a block diagram of a processor that may have more than one core.

FIG. 7 is a block diagram of a processor 700 that may have more than one core, may have an integrated memory controller, and may have integrated graphics according to embodiments of the invention. The solid lined boxes in FIG. 7 illustrate a processor 700 with a single core 702A, a system agent 710, a set of one or more bus controller units 716, while the optional addition of the dashed lined boxes illustrates an alternative processor 700 with multiple cores 702A-N, a set of one or more integrated memory controller unit(s) 714 in the system agent unit 710, and special purpose logic 708.

Thus, different implementations of the processor 700 may include: 1) a CPU with the special purpose logic 708 being integrated graphics and/or scientific (throughput) logic (which may include one or more cores), and the cores 702A-N being one or more general purpose cores (e.g., general purpose in-order cores, general purpose out-of-order cores, a combination of the two); 2) a coprocessor with the cores 702A-N being a large number of special purpose cores intended primarily for graphics and/or scientific (throughput); and 3) a coprocessor with the cores 702A-N being a large number of general purpose in-order cores. Thus, the processor 700 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 700 may be a part of and/or may be implemented on one or more substrates using any of a number of process technologies, such as, for example, BiCMOS, CMOS, or NMOS.

In one embodiment, each of the cores described above represents a different power domain that has a separate clock generator (e.g., PLL) and a voltage regulator.

In one embodiment, another portion of special purpose logic 708 comprises a power management unit (PMU) such as the PMU described above.

The memory hierarchy includes one or more levels of cache within the cores, a set or one or more shared cache units 706, and external memory (not shown) coupled to the set of integrated memory controller units 714. The set of shared cache units 706 may include one or more mid-level caches, such as level 2 (L2), level 3 (L3), level 4 (L4), or other levels of cache, a last level cache (LLC), and/or combinations thereof. While in one embodiment a ring based interconnect unit 712 interconnects the special purpose logic 708, the set of shared cache units 706, and the system agent unit 710/integrated memory controller unit(s) 714, alternative embodiments may use any number of well-known techniques for interconnecting such units. In one embodiment, coherency is maintained between one or more cache units 706 and cores 702A-N.

In some embodiments, one or more of the cores 702A-N are capable of multi-threading. The system agent 710 includes those components coordinating and operating cores 702A-N. The system agent unit 710 may include for example a power control unit (PCU) and a display unit. The PCU may be or include logic and components needed for regulating the power state of the cores 702A-N and the integrated graphics logic 708. The display unit is for driving one or more externally connected displays.

The cores 702A-N may be homogenous or heterogeneous in terms of architecture instruction set; that is, two or more of the cores 702A-N may be capable of execution the same instruction set, while others may be capable of executing only a subset of that instruction set or a different instruction set.

Figure 8:
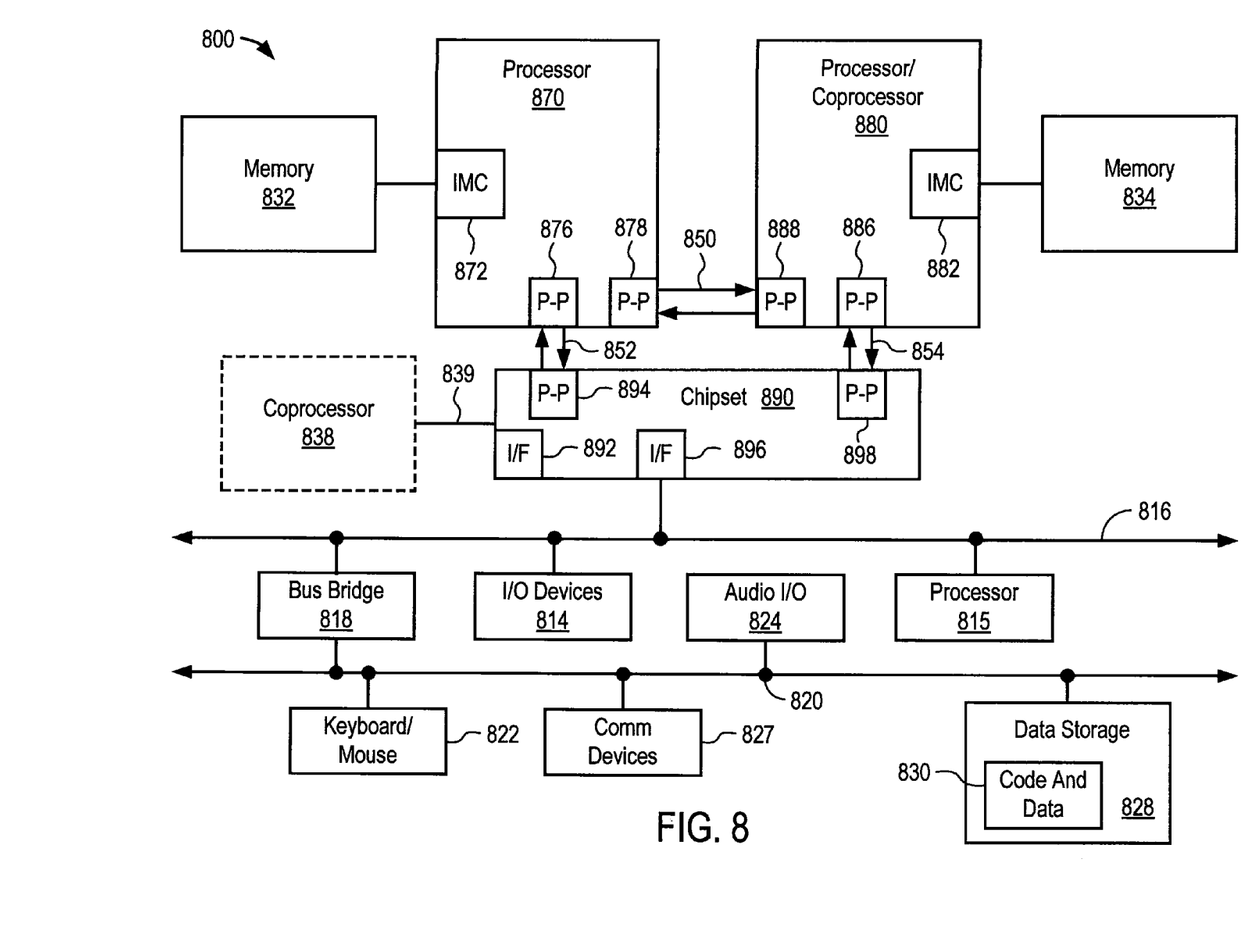
FIG. 8 is a block diagram of a SoC in accordance with an embodiment of the present invention.

FIG. 8 is a block diagram of a SoC 800 in accordance with an embodiment of the present invention. Similar elements in FIG. 7 bear like reference numerals. Also, dashed lined boxes are optional features on more advanced SoCs. In FIG. 8, an interconnect unit(s) 802 is coupled to: an application processor 810 which includes a set of one or more cores 202A-N and shared cache unit(s) 706; a system agent unit 710; a bus controller unit(s) 716; an integrated memory controller unit(s) 714; a set or one or more coprocessors 820 which may include integrated graphics logic, an image processor, an audio processor, and a video processor; an static random access memory (SRAM) unit 830; a direct memory access (DMA) unit 832; and a display unit 840 for coupling to one or more external displays. In one embodiment, the coprocessor(s) 820 include a special-purpose processor, such as, for example, a network or communication processor, compression engine, GPGPU, a high-throughput MIC processor, embedded processor, or the like.

In a first example embodiment, a method comprises: prior to transitioning to a new state for an integrated circuit (IC), calculating a sum of expected powers for a plurality of domains in the IC by calculating an expected current for each of the plurality of domains based on an individual domain frequency in the new state and multiplying the expected current with its associated voltage for each of the plurality of domains for the new state; comparing the sum to a power limit; and if the sum is greater than the power limit, then reducing the individual domain frequency associated with at least one domain in the plurality of domains to maintain the total instantaneous power of the IC below the power limit.

In another example embodiment, the subject matter of the first example embodiment can optionally include that calculating the expected current for each of the plurality of domains is based on current leakage, target frequency, and dynamic capacitance ($C_{dyn}$).

In another example embodiment, the subject matter of the first example embodiment can optionally include that calculating the expected current for each of the plurality of domains comprises calculating active and static current and summing the active and static current. In another example embodiment, the subject matter of the this example embodiment can optionally include that calculating active current comprises summing worst case $C_{dyn}$ for each core in the domain that is in a waking state and multiplying the worst case $C_{dyn}$ by the frequency and the associated voltage for the domain. In another example embodiment, the subject matter of this example embodiment can optionally include that the associated voltage is a function of the requested frequency.

In another example embodiment, the subject matter of the first example embodiment can optionally include that calculating static current comprises summing leakage for each core in the domain in the waking state. In another example embodiment, the subject matter of this example embodiment can optionally include that the leakage is the estimated leakage at the voltage and temperature of the domain.

In another example embodiment, the subject matter of the first example embodiment can optionally include that reducing the individual domain frequency associated with at least one domain in the plurality of domains comprises calculating a ratio between the sum of the power and the power limit and reducing the individual domain frequency associated with each domain in the plurality of domains by at least the ratio.

In another example embodiment, the subject matter of the first example embodiment can optionally include sending new frequency values specifying a frequency to use in each of the plurality of domains to clock generators (PLLs) associated with each of the plurality of domains.

In another example embodiment, the subject matter of the first example embodiment can optionally include that if the sum is less than the power limit, then transitioning the IC into the new state.

In another example embodiment, the subject matter of the first example embodiment can optionally include that the new state includes a frequency and one or more of a sleep state and execution state for each of the plurality of domains.

In another example embodiment, the subject matter of the first example embodiment can optionally include sending a notification in response to determining the sum is higher than the power limit.

In another example embodiment, the subject matter of the first example embodiment can optionally include determining the power limit by: determining available power based on one or more of alternating current adapter capability and charge state of a battery, if any; calculating a maximum power capability for the IC; calculating a maximum power for a portion of the IC that is not included in the plurality of domains; and setting the power limit as the difference between maximum power capability for the IC and the maximum power capability for the portion of the IC that is not included in the plurality of domains.

In a second example embodiment, an integrated circuit (IC) comprises: a plurality of domains; and a unit coupled to the domains to, in response to receiving a request from each domain in the plurality of domains, calculate a sum of expected powers for the plurality of domains by calculating an expected current for each of the plurality of domains based on an individual domain frequency in a new state and multiplying the expected current with its associated voltage for each of the plurality of domains for the new state, prior to transitioning to the new state, compare the sum to a power limit, and if the sum is greater than the power limit, then reduce the individual domain frequency associated with at least one domain in the plurality of domains to maintain the total instantaneous power of the IC below the power limit.

In another example embodiment, the subject matter of the second example embodiment can optionally include that the unit calculates the expected current for each of the plurality of domains based on current leakage, target frequency, and dynamic capacitance ($C_{dyn}$).

In another example embodiment, the subject matter of the second example embodiment can optionally include that the unit the expected current for each of the plurality of domains by calculating active and static current and summing the active and static current.

In another example embodiment, the subject matter of the second example embodiment can optionally include that the unit calculates active current by summing worst case $C_{dyn}$ for each core in the domain that is in a waking state and multiplying the worst case $C_{dyn}$ by the frequency and the associated voltage for the domain.

In another example embodiment, the subject matter of the second example embodiment can optionally include that the associated voltage is a function of the requested frequency.

In another example embodiment, the subject matter of the second example embodiment can optionally include that the unit calculates static current by summing leakage for each core in the domain in a waking state (e.g., a non-powered down state).

In another example embodiment, the subject matter of the second example embodiment can optionally include that the leakage is the estimated leakage at the voltage and temperature of the domain.

In another example embodiment, the subject matter of the second example embodiment can optionally include that the unit reduces the individual domain frequency associated with at least one domain in the plurality of domains by calculating a ratio between the sum of the power and the power limit and reducing the individual domain frequency associated with each domain in the plurality of domains by at least the ratio.

In another example embodiment, the subject matter of the second example embodiment can optionally include that the unit sends new frequency values specifying a frequency to use in each of the plurality of domains to clock generators (PLLs) associated with each of the plurality of domains.

In another example embodiment, the subject matter of the second example embodiment can optionally include that if the sum is less than the power limit, then the IC transitions into the new state.

In another example embodiment, the subject matter of the second example embodiment can optionally include that the new state includes a frequency and one or more of a sleep state and execution state for each of the plurality of domains.

In a third example embodiment, a method comprises: generating a new frequency for each of a plurality of domains in an integrated circuit (IC) based on a comparison between a power limit for the IC and a worst case power calculation derived from a worst case current determination associated with a state said each domain requests to enter; and signaling clock generators (PLLs) associated with each of the plurality of domains the new frequency of a clock to generate for use in each of the plurality of domains to clock generators (PLLs) associated with each of the plurality of domains.

In another example embodiment, the subject matter of the third example embodiment can optionally include that the worst case current determination comprises is based on a calculation of the expected current for each of the plurality of domains based on current leakage, target frequency, and dynamic capacitance ($C_{dyn}$).

In a fourth example embodiment, an article of manufacture has one or more non-transitory computer readable media storing instructions which when executed causes an integrated circuit to perform a method comprising: prior to transitioning to a new state for an integrated circuit (IC), calculating a sum of expected powers for a plurality of domains in the IC by calculating an expected current for each of the plurality of domains based on an individual domain frequency in the new state and multiplying the expected current with its associated voltage for each of the plurality of domains for the new state; comparing the sum to a power limit; and if the sum is greater than the power limit, then reducing the individual domain frequency associated with at least one domain in the plurality of domains to maintain the total instantaneous power of the IC below the power limit.

In another example embodiment, the subject matter of the fourth example embodiment can optionally include that calculating the expected current for each of the plurality of domains is based on current leakage, target frequency, and dynamic capacitance ($C_{dyn}$).

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Some portions of the detailed descriptions described above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method comprising:
   prior to transitioning to a new state for an integrated circuit (IC), calculating a sum of expected powers for a plurality of domains in the IC by calculating an expected current for each of the plurality of domains based on an individual domain frequency in the new state and multiplying the expected current with its associated voltage for each of the plurality of domains for the new state;
   comparing the sum to a power limit; and
   if the sum is greater than the power limit, then reducing the individual domain frequency associated with at least one domain in the plurality of domains to maintain the total instantaneous power of the IC below the power limit by calculating a ratio between the sum of the power and the power limit and reducing the individual domain frequency associated with each domain in the plurality of domains by at least the ratio.

2. The method defined in claim 1 wherein calculating the expected current for each of the plurality of domains based on current leakage, target frequency, and dynamic capacitance ($C_{dyn}$).

3. The method defined in claim 1 wherein calculating the expected current for each of the plurality of domains comprises calculating active and static current and summing the active and static current.

4. The method defined in claim 3 wherein calculating active current comprises summing worst case $C_{dyn}$ for each core in the domain that is in a waking state and multiplying the worst case $C_{dyn}$ by the frequency and the associated voltage for the domain.

5. The method defined in claim 4 wherein the associated voltage is a function of the requested frequency.

6. The method defined in claim 3 wherein calculating static current comprises summing leakage for each core in the domain in the waking state.

7. The method defined in claim 6 wherein the leakage is the estimated leakage at the voltage and temperature of the domain.

8. The method defined in claim 1 further comprising sending new frequency values specifying a frequency to use in each of the plurality of domains to clock generators (PLLs) associated with each of the plurality of domains.

9. The method defined in claim 1 further comprising, if the sum is less than the power limit, then transitioning the IC into the new state.

10. The method defined in claim 1 wherein the new state includes a frequency and one or more of a sleep state and execution state for each of the plurality of domains.

11. The method defined in claim 1 further comprising sending a notification in response to determining the sum is higher than the power limit.

12. A method comprising:
    prior to transitioning to a new state for an integrated circuit (IC), calculating a sum of expected powers for a plurality of domains in the IC by calculating an expected current for each of the plurality of domains based on an individual domain frequency in the new state and multiplying the expected current with its associated voltage for each of the plurality of domains for the new state;
    comparing the sum to a power limit; and
    if the sum is greater than the power limit, then reducing the individual domain frequency associated with at least one domain in the plurality of domains to maintain the total instantaneous power of the IC below the power limit, wherein the power limit is determined by:
    determining available power based on one or more of alternating current adapter capability and charge state of a battery;
    calculating a maximum power capability for the IC;
    calculating a maximum power for a portion of the IC that is not included in the plurality of domains; and
    setting the power limit as the difference between maximum power capability for the IC and the maximum power capability for the portion of the IC that is not included in the plurality of domains.

13. An integrated circuit (IC) comprising:
    a plurality of domains; and
    a unit coupled to the domains to, in response to receiving a request from each domain in the plurality of domains, calculate a sum of expected powers for the plurality of domains by calculating an expected current for each of the plurality of domains based on an individual domain frequency in a new state and multiplying the expected current with its associated voltage for each of the plurality of domains for the new state, prior to transitioning to the new state,
    compare the sum to a power limit, and
    if the sum is greater than the power limit, then reduce the individual domain frequency associated with at least one domain in the plurality of domains to maintain the total instantaneous power of the IC below the power limit by calculating a ratio between the sum of the power and the power limit and reducing the individual domain frequency associated with each domain in the plurality of domains by at least the ratio.

14. The apparatus defined in claim 13 wherein the unit calculates the expected current for each of the plurality of domains based on current leakage, target frequency, and dynamic capacitance ($C_{dyn}$).

15. The apparatus defined in claim 13 wherein the unit the expected current for each of the plurality of domains by calculating active and static current and summing the active and static current.

16. The apparatus defined in claim 15 wherein the unit calculates active current by summing worst case $C_{dyn}$ for each core in the domain that is in a waking state and multiplying the worst case $C_{dyn}$ by the frequency and the associated voltage for the domain.

17. The apparatus defined in claim 15 wherein the unit calculates static current by summing leakage for each core in the domain in a waking state.

18. The apparatus defined in claim 17 wherein the leakage is the estimated leakage at the voltage and temperature of the domain.

19. The apparatus defined in claim 13 wherein the unit sends new frequency values specifying a frequency to use in each of the plurality of domains to clock generators (PLLs) associated with each of the plurality of domains.

20. A method comprising:
generating a new frequency for each of a plurality of domains in an integrated circuit (IC) based on a comparison between a power limit for the IC and a worst case power calculation derived from a worst case current determination associated with a state said each domain requests to enter and by calculating a ratio between the worst case power calculation and the power limit and reducing the individual domain frequency associated with each domain in the plurality of domains by at least the ratio; and
signaling clock generators (PLLs) associated with each of the plurality of domains the new frequency of a clock to generate for use in each of the plurality of domains to clock generators (PLLs) associated with each of the plurality of domains.

21. The method defined in claim 20 wherein the worst case current determination comprises is based on a calculation of the expected current for each of the plurality of domains based on current leakage, target frequency, and dynamic capacitance ($C_{dyn}$).

22. An article of manufacture having one or more non-transitory computer readable media storing instructions which when executed causes an integrated circuit to perform a method comprising:
prior to transitioning to a new state for an integrated circuit (IC), calculating a sum of expected powers for a plurality of domains in the IC by calculating an expected current for each of the plurality of domains based on an individual domain frequency in the new state and multiplying the expected current with its associated voltage for each of the plurality of domains for the new state;
comparing the sum to a power limit; and
if the sum is greater than the power limit, then reducing the individual domain frequency associated with at least one domain in the plurality of domains to maintain the total instantaneous power of the IC below the power limit by calculating a ratio between the sum of the power and the power limit and reducing the individual domain frequency associated with each domain in the plurality of domains by at least the ratio.

23. The article of manufacture defined in claim 22 wherein calculating the expected current for each of the plurality of domains based on current leakage, target frequency, and dynamic capacitance ($C_{dyn}$).

* * * * *